(12) United States Patent
Miyamoto

(10) Patent No.: US 7,815,443 B2
(45) Date of Patent: Oct. 19, 2010

(54) ELECTRICAL CONNECTION BOX AND METHOD OF ASSEMBLING THE ELECTRICAL CONNECTION BOX

(75) Inventor: Takashi Miyamoto, Yokkaichi (JP)

(73) Assignee: Sumitomo Wiring Systems, Ltd., Mie (JP)

( * ) Notice: Subject to any disclaimer, the term of this patent is extended or adjusted under 35 U.S.C. 154(b) by 0 days.

(21) Appl. No.: 12/461,685

(22) Filed: Aug. 20, 2009

(65) Prior Publication Data
US 2010/0105221 A1    Apr. 29, 2010

(30) Foreign Application Priority Data
Oct. 28, 2008  (JP) .............................. 2008-277479

(51) Int. Cl.
*H01R 12/00* (2006.01)
(52) U.S. Cl. ................................. 439/76.2
(58) Field of Classification Search ........... 439/76.2; 361/395, 399, 752–761
See application file for complete search history.

(56) References Cited

U.S. PATENT DOCUMENTS

| | | | | |
|---|---|---|---|---|
| 4,176,315 | A * | 11/1979 | Sunnarborg | 324/156 |
| 4,317,154 | A * | 2/1982 | Passarella | 361/119 |
| 4,555,638 | A * | 11/1985 | Lobe | 307/10.1 |
| 4,831,498 | A * | 5/1989 | Baba | 361/816 |
| 5,023,752 | A * | 6/1991 | Detter et al. | 361/752 |
| 5,111,362 | A * | 5/1992 | Flamm et al. | 361/736 |
| 5,430,612 | A * | 7/1995 | Simon et al. | 361/752 |
| 5,497,290 | A * | 3/1996 | Fukui et al. | 361/752 |
| 5,546,281 | A * | 8/1996 | Poplawski et al. | 361/752 |
| 5,731,964 | A * | 3/1998 | Kitakubo et al. | 361/816 |
| 5,734,558 | A * | 3/1998 | Poplawski et al. | 361/752 |
| 5,959,844 | A * | 9/1999 | Simon et al. | 361/759 |
| 6,025,820 | A * | 2/2000 | Salmon et al. | 345/75.1 |
| 6,201,704 | B1 * | 3/2001 | Poplawski et al. | 361/753 |
| 6,249,442 | B1 * | 6/2001 | Watanabe | 361/801 |
| 6,430,055 | B2 * | 8/2002 | Saito | 361/752 |

(Continued)

FOREIGN PATENT DOCUMENTS

JP         U-6-38291         5/1994

(Continued)

*Primary Examiner*—T C Patel
*Assistant Examiner*—Vladimir Imas
(74) *Attorney, Agent, or Firm*—Oliff & Berridge, PLC

(57) ABSTRACT

An electrical connection box in which operability is improved such that even if distortion or flexure occurs in a case, a boss protruding from the case can easily pass through an elongate hold provided in an internal circuit body. A first boss and a second boss protrude from the inner surface of one of a lower case and an upper case. The first boss protrudes and the second boss protrude toward the inner surface of the second of the lower case and the upper case. The first boss and the second boss are cylindrical. First holes through which the first boss pass are aligned with each other in an internal circuit body that is installed in the case. The first holes have a completely cylindrical shape concentric with the first boss. Second holes through which the second boss 20 pass, are provided and aligned with each other in the internal circuit body 10. The second holes have an oblong shape with a long side lying in a direction parallel to an axis that connects the centers of the first holes and second holes.

12 Claims, 9 Drawing Sheets

U.S. PATENT DOCUMENTS

| | | | |
|---|---|---|---|
| 6,476,320 B1* | 11/2002 | Ritter et al. | 174/66 |
| 6,483,711 B1* | 11/2002 | Huang | 361/736 |
| 6,483,719 B1* | 11/2002 | Bachman | 361/816 |
| 6,594,143 B2* | 7/2003 | Yano et al. | 361/679.26 |
| 6,653,567 B2* | 11/2003 | Ritter et al. | 174/66 |
| 6,705,878 B2* | 3/2004 | Liang | 439/76.1 |
| 6,728,110 B2* | 4/2004 | Koyama | 361/752 |
| 6,762,944 B2* | 7/2004 | Mizusaki | 361/804 |
| 6,955,544 B2* | 10/2005 | Miquel et al. | 439/76.1 |
| 7,095,617 B1* | 8/2006 | Ni | 361/736 |
| 7,105,741 B2* | 9/2006 | Banar et al. | 174/50 |
| 7,195,403 B2* | 3/2007 | Oki et al. | 385/92 |
| 7,227,761 B2* | 6/2007 | Estes et al. | 361/810 |
| 2006/0104040 A1* | 5/2006 | Hsu | 361/752 |
| 2008/0055870 A1* | 3/2008 | Callahan et al. | 361/752 |
| 2008/0158824 A1* | 7/2008 | Aoki et al. | 361/711 |
| 2008/0259537 A1* | 10/2008 | Arisaka et al. | 361/680 |
| 2009/0034214 A1* | 2/2009 | Kao et al. | 361/752 |
| 2009/0161320 A1* | 6/2009 | Sugiyama et al. | 361/714 |

FOREIGN PATENT DOCUMENTS

JP  A-2006-319198  11/2006

* cited by examiner (A)

(B)

ELECTRICAL CONNECTION BOX AND METHOD OF ASSEMBLING THE ELECTRICAL CONNECTION BOX

CROSS-REFERENCE TO RELATED APPLICATIONS

This application claims priority to JP 2008-277479 filed in Japan on Oct. 28, 2008, the entire disclosure of which is hereby incorporated by reference in its entirety.

BACKGROUND

1. Technical Field

The exemplary embodiments are directed towards an electrical connection box and a method of assembling the electrical connection box. Specifically, in an electrical connection box for a motor vehicle which houses an internal circuit body within an upper case and a lower case, the exemplary embodiments improve assembly operability of the internal circuit body, and accurately position and assemble the electrical connection box without generating flexure.

2. Background Technology

In this type of electrical connection box, in which an internal circuit body is inserted into one of the cases and then the other case is assembled onto the first case, when the internal circuit body is inserted into and engaged with the case, it needs to be accurately positioned and fixed. It is also necessary to increase assembly operability.

Because of this, various proposals have been made. There are many instances in which a round hole for positioning, and an elongate hole for adjusting position and preventing rotation are arranged.

For example, in Japanese Published Utility Model Patent Application 6-38291 (JP-U-6-38291), as shown in FIGS. 13(A) and (B), in a box in which a printed circuit board 101 is housed in a housing 100, and a cover 102 is attached, at least two positioning pins 103a, 103b are protrudingly arranged on the cover 102. A positioning hole 104 and an elongate hole 105 into which the positioning pins 103 are inserted are arranged in the printed circuit board 101, and a positioning boss 106 and a rotation-preventing boss 107 are arranged on the housing 100.

The elongate hole 105 arranged in the printed circuit board 101, which is arranged in the cover, is arranged substantially at the center, and the positioning hole 104 is arranged at a peripheral position of the printed circuit board 101. Meanwhile, on the housing 100 side, a cylindrical positioning boss 106 is arranged at a position corresponding to the elongate hole 105 in the printed circuit board, and an oblong rotation-preventing boss 107 is arranged at a position corresponding to the positioning hole 104 in the printed circuit board. With respect to the positioning boss 106 arranged at the center of the housing 100, the rotation-preventing boss 107 arranged at the peripheral side is arranged on the line parallel to a surrounding wall 100a on a long side of the housing 100 and is positioned substantially at the center of a surrounding wall 100b on a short side.

That is, the positioning pin 103a at the center of the cover 102 goes through the elongate hole 105 of the printed circuit board and is inserted into the round positioning boss 106 of the housing 100. The positioning pin 103b at the periphery of the cover 102 is inserted into the oblong rotation-preventing boss 107 of the housing via the positioning hole 104.

In the box, the positioning pins 103a, 103b of the cover 102 pass through the positioning hole 104 and the elongate hole 105 of the printed circuit board 101, and the printed circuit board is fixed with screws 120. Thus, the printed circuit board 101 fixed with the cover 102 in advance is inserted into the housing 100, and the positioning pin 103a protruded from the center is inserted into the positioning boss of the housing 100, and the positioning pin 103b protruded from the periphery is inserted into the rotation-preventing boss 107 of the housing 100.

That is, in JP-U-6-38291, the positioning pin 103a at the center of the cover 102 goes through the elongate hole of the printed circuit board and then is engagingly positioned in a cylindrical boss on the housing side. Meanwhile, the positioning pin 103b at the periphery passes through the round positioning hole of the printed circuit board and is positioned, and then is engaged with the oblong rotation-preventing boss on the housing side.

However, if there is distortion or flexure in the cover 102, the positioning pins 103 are inclined. Additionally, if there is distortion or flexure in the housing 100, the bosses 106 and 107 are inclined.

Thus, if there is distortion or flexure in the cover 102, it is difficult to insert the positioning pin 103a into the elongate hole 105 of the printed circuit board 101. In the same manner if there is distortion or flexure in the housing 100, there is a problem that it is difficult to insert the positioning pin 103b into the oblong rotation-preventing boss 107 of the housing 100.

SUMMARY

The exemplary embodiments address the above-mentioned problems and other problems. By specifying a shape of an elongate hole for positioning adjustment, it is easy to engage an internal circuit body with a boss which is protrudingly arranged from the case side, and the internal circuit body can be more accurately adjusted and positioned and assembled to the case.

MEANS OF SOLVING THE PROBLEMS

In order to solve the above-mentioned problem and/or other problems, the exemplary embodiments provide an electrical connection box in which an internal circuit body is installed. The internal circuit body defines cylindrical first holes that are aligned with each other and second holes that are aligned with each other, the second holes being oblong with a long side lying in a direction parallel to an axis that connects centers of the first and second. The electrical connection box includes a case that houses the internal circuit body. a first boss that passes through the first holes and a second boss that passes through the second holes, are each cylindrical and protrude from an inner surface of one of the lower case and the upper case toward the other case. The first holes being concentric with the first boss.

The case formed of a lower case and an upper case is integrally molded by resin such as polypropylene, nylon, etc. In order to reduce the weight, etc., it is relatively thin and it has relatively large area which houses the internal circuit body. Because of this, it is easy to generate distortion or flexure in the case. In particular, if the area increases in a large electrical connection box, it is easier to generate the distortion and flexure.

If distortion or flexure is generated in the case, bosses protruding from an inner surface of a top wall of the upper case and a bottom wall of the lower case do not protrude in a direction perpendicular to the upper wall or the bottom wall; thus, they tend to be inclined, and it is difficult to position the bosses with respect to the holes arranged in the internal circuit body.

Thus, according to the exemplary embodiments the first and second bosses which protrude from the case are both cylindrical. Meanwhile, with respect to through-holes arranged in the internal circuit body, a first hole through which the first boss passes is a completely round shape, and has the same shape as the first boss, and the internal diameter of the first hole is provided with a clearance with respect to the external diameter of the first boss. As described before, the second hole, which has an oblong shape and through which the second boss passes, specifies an oblong shape having a long side in a direction parallel to a straight line connecting the center of the first hole and the center of the second hole. The short-axis dimension between the opposite long sides is the same as the diameter of the second boss, and the long-axis dimension in the perpendicular direction is about twice the diameter of second boss, but as long as distortion and flexure of the upper case is absorbed, the long-axis dimension is not limited to this.

If distortion or flexure is generated in the case, the second boss is inclined with respect to a longitudinal direction of the first boss, because the first boss, which protrudes from the case, passes through the first hole of the internal circuit body, which has a completely round shape. Therefore, as described before, if the second hole through which the second boss passes has an oblong shape, with a long side in a direction parallel to an axis connecting the center of the first hole and the center of the second hole, the long-axis direction of the oblong shape exists in a direction in which the second boss is inclined, and the second hole of the internal circuit body, which is oblong, can easily be engaged with the second boss.

In an exemplary embodiment, the first boss is arranged at the center of the case, and that the second boss is arranged at the peripheral portion of the case, while the first hole arranged in the internal circuit body is arranged at the center, and the second hole is arranged at the peripheral portion.

In accordance with this embodiment, when flexure or distortion is generated in the case, the case peripheral portion is easily curved in a circular-arc shape about the center of the case. That is, when the case has a horizontal elongate rectangular shape, the right and left side edges tend to be bent downwardly. Thus, with respect to the second boss which protrudes from the peripheral portion in which distortion is easily generated, if a second hole which is formed in an oblong shape is arranged in the internal circuit body, assembling can be easily performed.

In particular, in combination with distortion generated in a right/left direction and distortion generated in a front/back direction, distortion is most frequently generated in the corner portions of the periphery of the case. Thus, the second boss is arranged at a corner portion of the periphery of the case. Opposite to this, the second hole, which is oblong, is arranged at a corner portion of the periphery of the internal circuit body. The internal circuit body can be accurately engaged to the inside of the case as assembly performance increases.

At that time, if the first boss and the first hole are arranged at the center of the case and the internal circuit body and the second hole, which is oblong, is arranged at a corner portion, the straight line connecting the first and second holes is positioned on a diagonal line of the internal circuit body, so the long side of the parallel direction of the second hole becomes a direction inclined with respect to the periphery of the internal circuit body.

In an exemplary embodiment, a plurality of ribs protrude from an outer periphery of the first boss, the ribs pressing against an internal peripheral surface of the first holes, a pair of ribs protruding from an outer periphery of the second boss, the pair of ribs pressing against an inner peripheral surface of a long side of the second holes.

The ribs arranged on the outer circumference of the first boss and pressing against an internal circumferential surface of the first hole are for preventing rotation. In order to effectively use the rotation-preventing operation, the rotation prevention in the right/left and back/front direction is performed at 90-degree intervals, and it is also acceptable to arrange three ribs at 120-degree intervals.

Meanwhile, the ribs which are arranged on the external circumference of the second boss and press against the internal circumferential surface of the second hole press against the internal circumferential surface on the long side so as to suppress moving.

Furthermore, in an exemplary embodiment a first outer cylinder into which a protruding end of the first boss is inserted and a second outer cylinder into which a tip end of the second boss is inserted protrude from an inner surface of the other case, and a tapered protrusion that is inclined with respect to an axial direction, and which corrects the protrusion direction of the second boss to a direction that is perpendicular to the inner surface of the case, is provided at an inner peripheral surface of the second outer cylinder.

Additionally, the exemplary embodiments include a method of assembling the electrical connection box.

According to the assembling method, the one case, on which the first and second bosses are arranged, is used as the upper case, an upper surface opening is provided by using the upper wall of the upper case as a lower surface, the internal circuit body engages through the upper surface opening, the lower cover, which is the other case, is put on, and the lower cover is locked to the upper case.

Therefore, the first and second bosses protrude from the internal surface of the upper wall of the upper case. A first outer casing that engages the first boss, and a second outer casing that engages the second boss protrude from an internal surface of the lower case after the internal circuit body is inserted into the upper case.

The internal circuit body housed between the upper case and the lower case includes a printed circuit board, an insulating plate to which a bus bar is affixed, an insulating plate covering an electrical wire, an insulating plate which exists in the printed circuit board, etc. The first and second holes are arranged in the printed circuit board and the insulating plate.

EFFECTS OF THE INVENTION

As described above, according to the exemplary embodiments, first and second bosses, which have a cylindrical shape, are protrudingly arranged on the case side. A first hole, which is completely cylindrical and through which the first boss passes, and a second hole, which is oblong and through which the second boss passes, are arranged in an internal circuit body. The shape of the second hole is oblong so as to correspond to a direction in which, when distortion or flexure is generated in the case, the second boss is easily inclined.

Thus, upon considering flexure and distortion generated in the case, a through hole for a boss is set in the internal circuit body that engages with the case. Thus, even if there is flexure or distortion in the case, assembly performance of the internal circuit body can be improved. Also, engagement with the case can be performed without any difficulty, without distorting the internal circuit body, and accurate positioning and installation can be achieved.

BRIEF DESCRIPTION OF THE DRAWINGS

FIG. 1(A) is the plan view, FIG. 1(B) is the side view.

FIG. 3(A) is a plan view showing the inner surface side of the upper case, and FIG. 3(B) is a cross-sectional view of the upper case.

FIG. 10(A) is a plan view showing the inner surface side of the lower case, FIG. 10(B) is a cross-sectional view of the lower case.

DETAILED DESCRIPTION OF EMBODIMENTS

The following explains an electrical connection box of an embodiment of this invention with reference to drawings.

Figure 1:
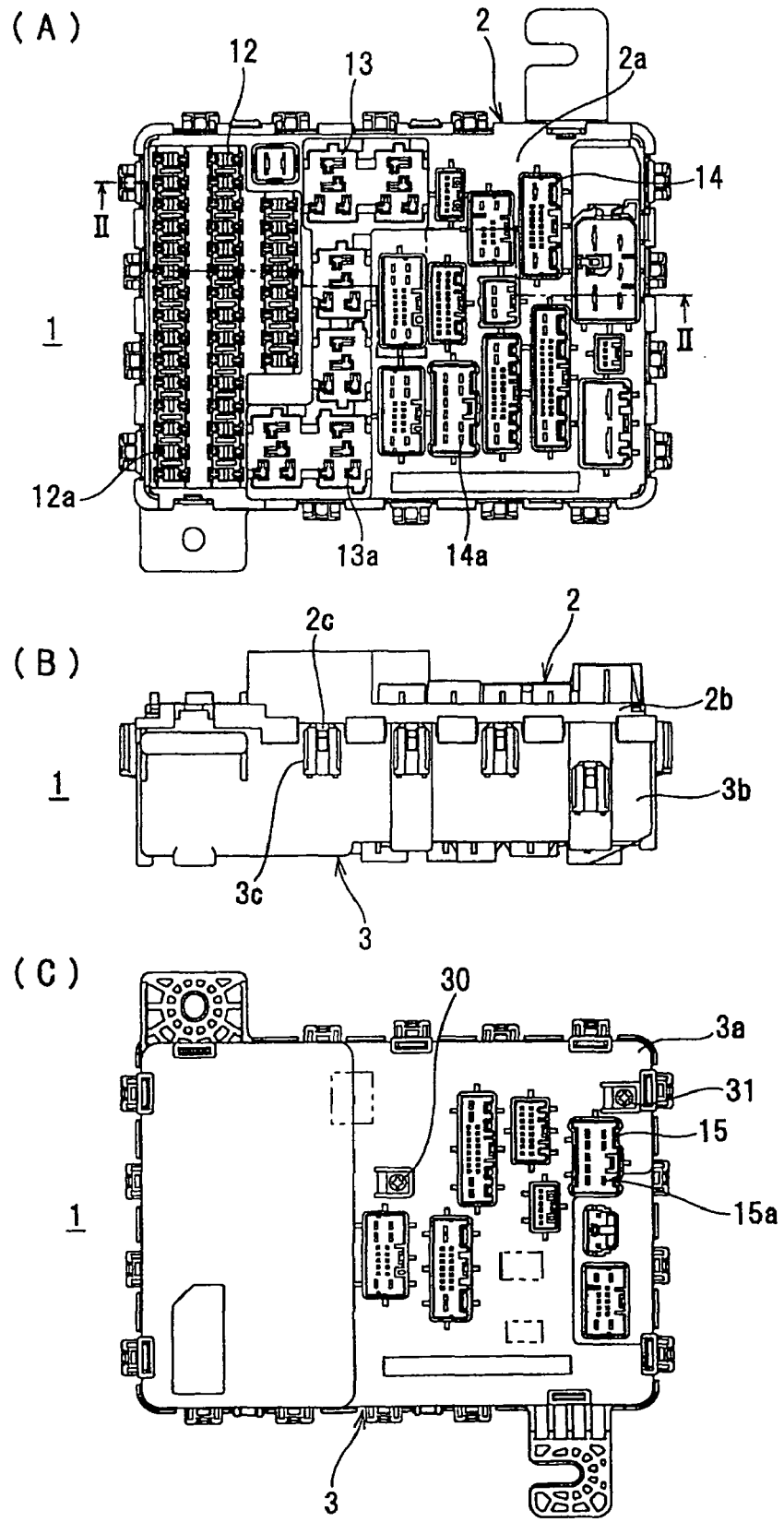
FIGS. 1(A)-1(B) illustrate an electrical connection box in an exemplary embodiment.
FIG. 1(C) is the bottom view.
Figure 2:
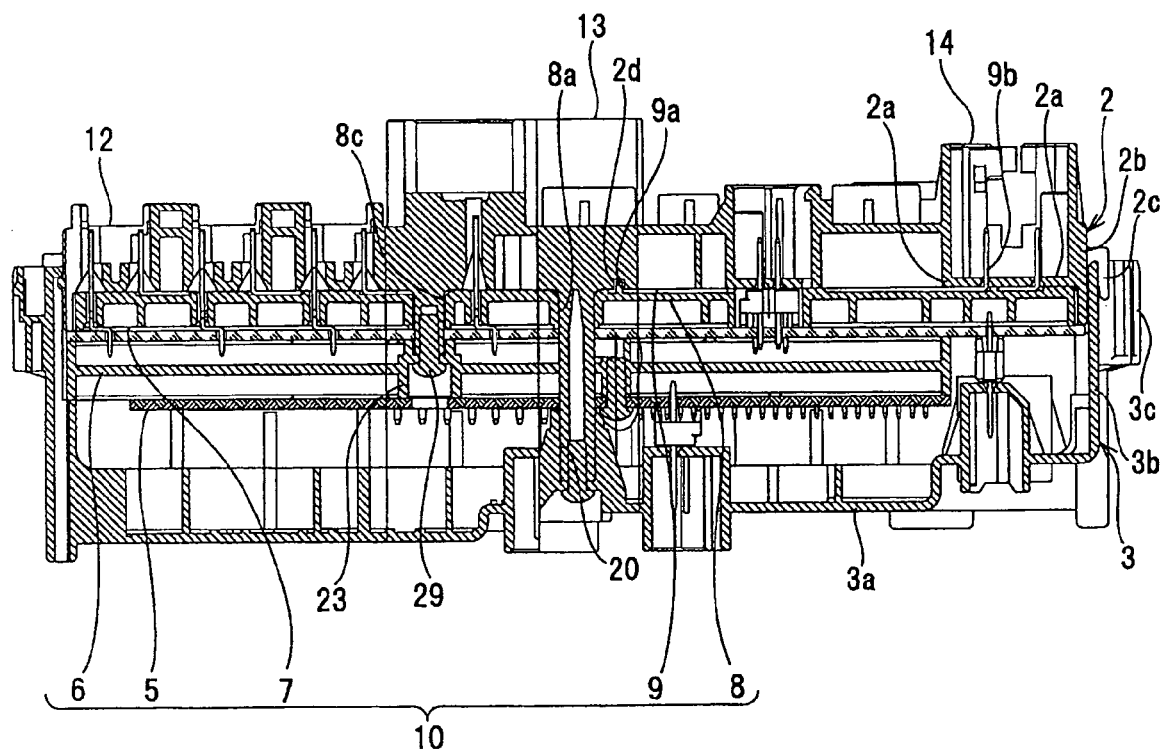
FIG. 2 is a cross-sectional view of FIG. 1(A) taken along lines II-II.

An electrical connection box 1 of an embodiment shown in FIG. 1 is mounted in an automobile. FIG. 1 shows the electrical connection box 1. FIG. 1(A) is a plan view, FIG. 1(B) is a front view, and FIG. 1(C) is a bottom view. FIG. 2 is a cross-sectional view of FIG. 1(A) taken along lines II-II.

The electrical connection box 1 includes a case by locking lock portions 2c and 3c arranged on peripheral walls 2b and 3b of the upper case 2 and the lower case 3, and houses an internal circuit body 10 in the inside of the case.

As shown in a cross-sectional view of FIG. 2, the internal circuit body 10 has, in a layered manner, in order from a lower case 1 side, a lower layer printed circuit board 5, an insulating plate 6, an upper layer printed circuit board 7, and an insulating plate 8, and is directly fixed to a bus bar 9 on the internal surface of the upper wall 2a of the upper case 2. The fixing is performed by press-fitting a fixing piece 9a arranged on the bus bar 9 to a press-fitting groove 2d arranged inside of the upper wall 2a.

In assembling the electrical connection box 1, the upper case 2 is inverted and arranged by using the upper wall 2a as a lower surface. With respect to the upper case 2, the bus bar 9, the insulating plate 8, the upper layer printed circuit board 7, the insulating plate 6, and the lower layer printed circuit board 5 are assembled, in order, and lastly the lower case 3 is put on and locked, completing the assembly.

The upper case 2 and the lower case 3 are constituted by a resin molded product and have a horizontally elongate rectangular shape.

In the upper wall 2a of the upper case, as shown in FIG. 1(A), a fuse housing portion 12, a relay housing portion 13, and a connector housing portion 14 are protrudingly arranged. As described before, tabs 9b, which are fixed to bus bars 9 that are fixed to the inside of the upper wall 2a, protrude into the terminal holes 12a, 13a, and 14a of the fuse housing portion 12, the relay housing portion 13, and the connector housing portion 14.

The peripheral wall 2b of the upper case 2 has a dimension such that it engages the insulating plate 8 arranged on the internal side of the peripheral wall 2b.

Figure 3:
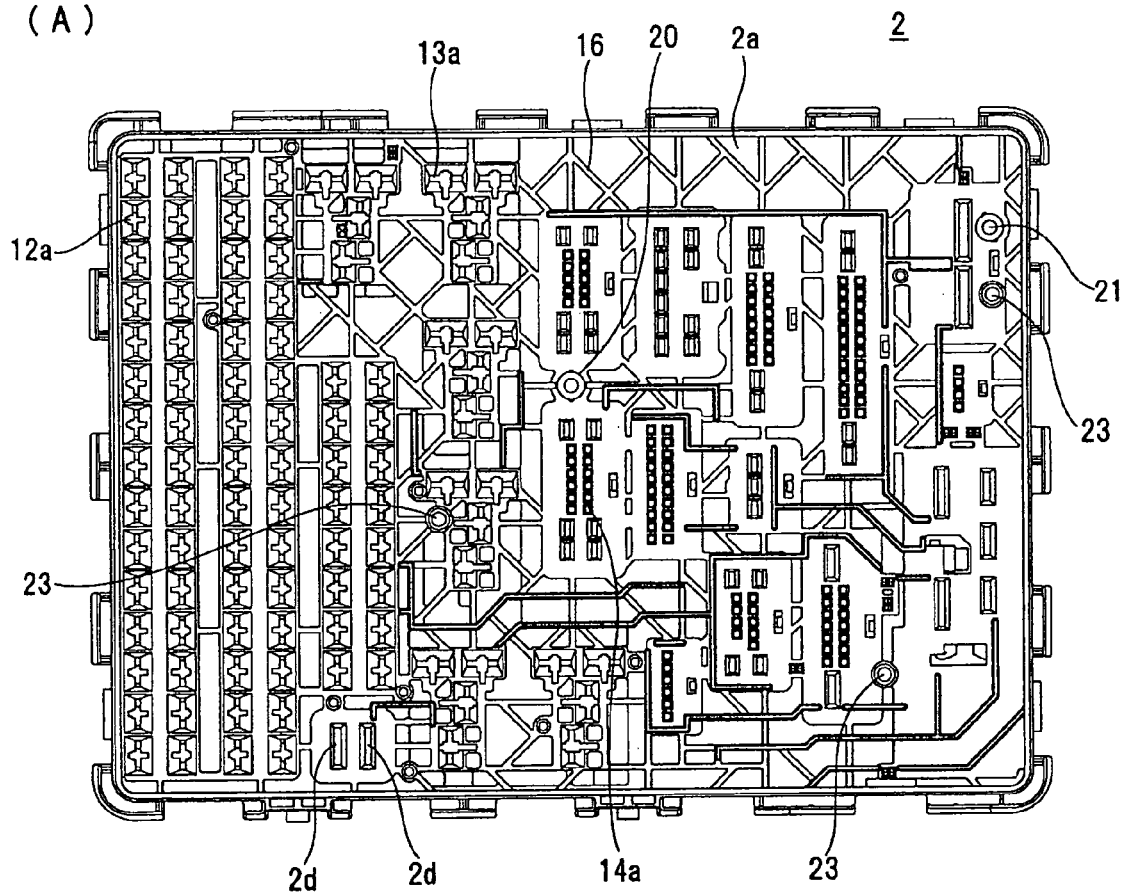
FIGS. 3A and 3B illustrate an upper case in an exemplary embodiment.
Figure 3:
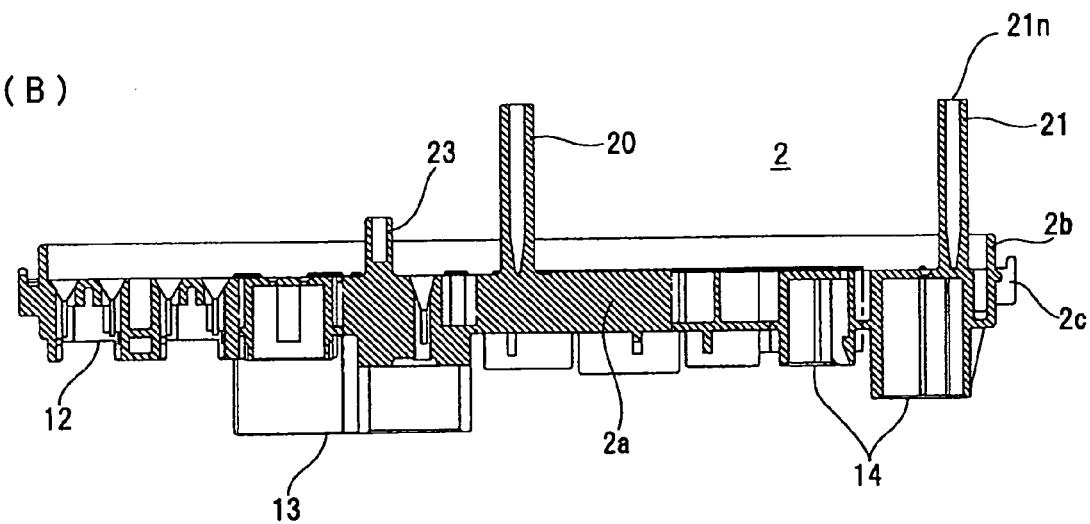

As shown in FIGS. 3A and 3B, the first boss 20, which is cylindrical, protrudes from the center of the inside surface of the upper wall 2a of the upper case 2, and the second boss 21, which is cylindrical, protrudes from a corner of the periphery. The respective first and second bosses 20, 21 have substantially the same height.

On the inside surface of the upper wall of the upper case 2, screw cylinders 23 for fixing the internal circuit body are protrudingly arranged at three locations, respectively, including a position adjacent to the second boss 21. The screw cylinders 23 are shorter than the respective first and second bosses 20, 21.

Figure 4:
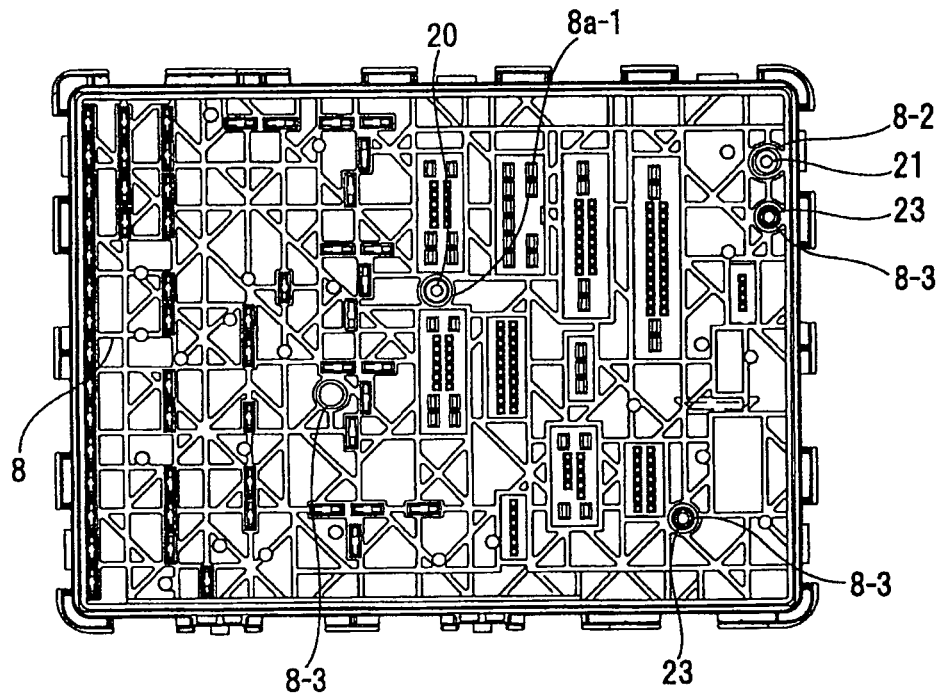
FIG. 4 is a plan view of the state in which an insulating plate is assembled to the upper case illustrated in FIGS. 3A and 3B.

As shown in FIG. 4, the outer shape of the insulating plate 8 and the upper layer printed board 7 arranged on the inside surface of the upper wall 2a of the upper case 2 has a horizontal rectangular shape, the same as the upper and lower cases 2, 3. The outer shape is such that it can engage the peripheral wall 3b of the lower case 3b.

In the insulating plate 8, there are arranged a first hole 8-1 through which the first boss 20 passes, a second hole 8-2 through which the second boss 21 passes, and third holes 8-3 through which the screw cylinders 23 pass.

Figure 5:
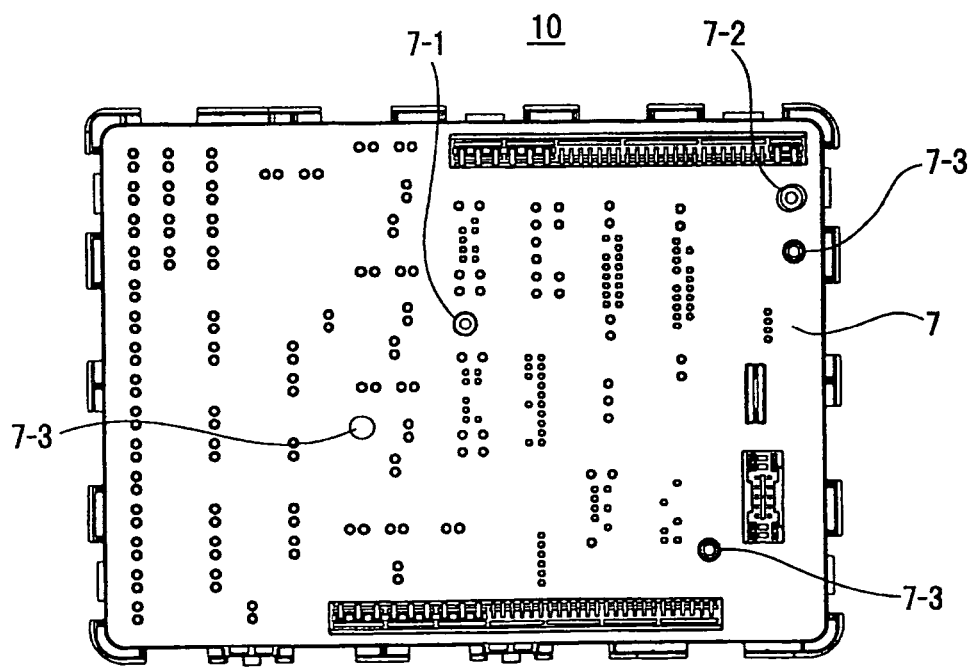
FIG. 5 is a plan view showing the upper surface of an upper printed board at the upper surface of an internal circuit body in an exemplary embodiment.

As shown in FIG. 5, in the upper layer printed board 7, there are arranged a first hole 7-1 through which the first boss 20 passes, a second hole 7-2 through which the second boss 21 passes, and third holes 7-3 through which the screw cylinders 23 pass.

Figure 6:
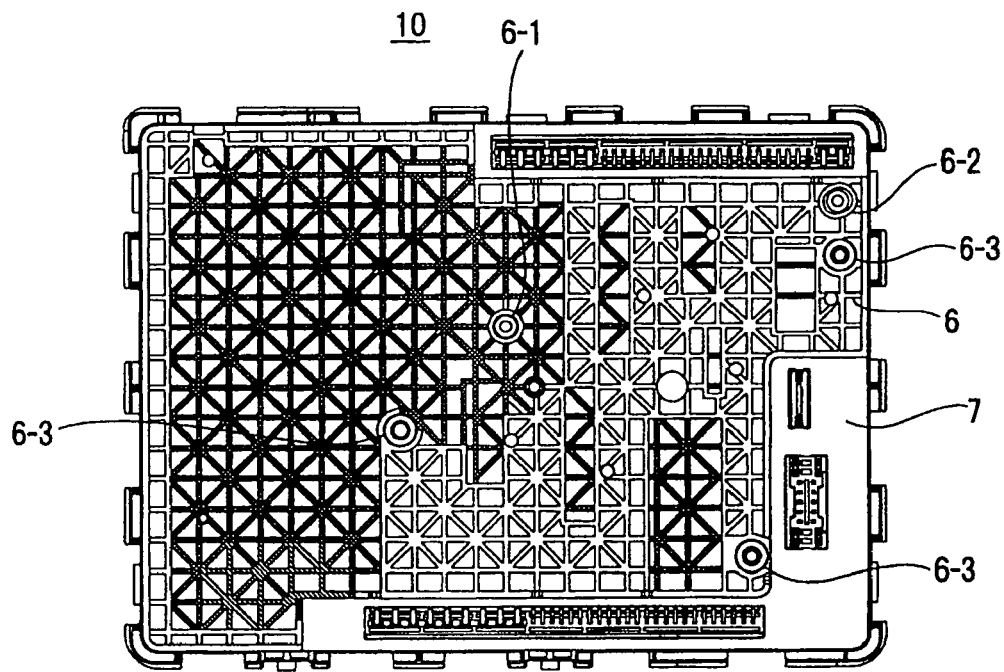
FIG. 6 is a plan view showing a state in which an insulating plate is assembled to the upper printed board of an internal circuit body in an exemplary embodiment.

As shown in FIG. 6, in the insulating plate 6 as well, there are arranged a first hole 6-1 through which the first boss 20 passes, a second hole 6-2 through which the second boss 21 passes, and third holes 6-3 through which the screw cylinders 23 pass.

Figure 7:
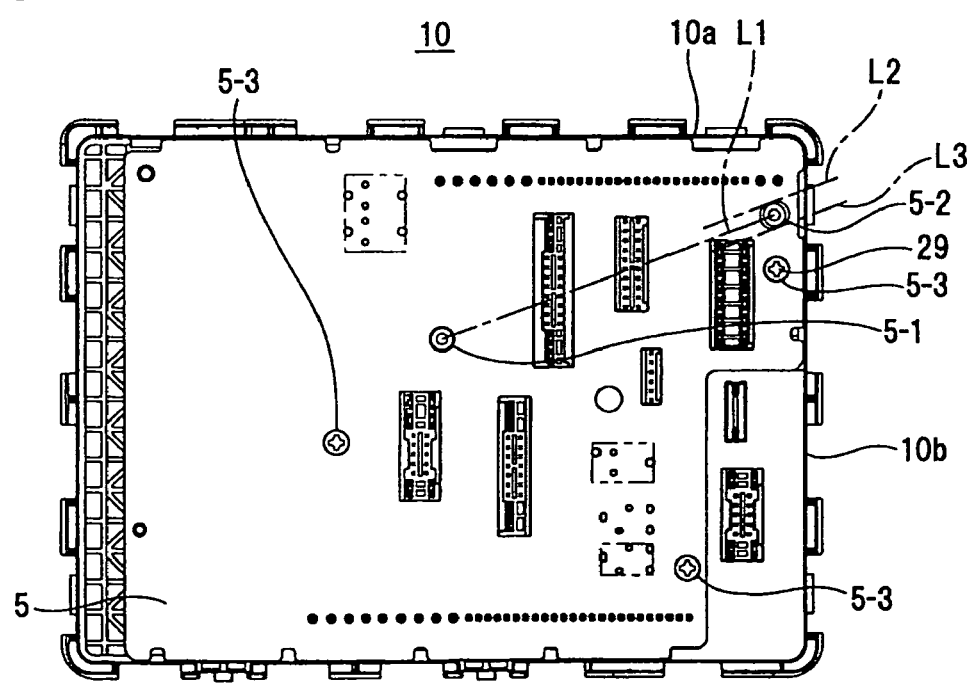
FIG. 7 is a plan view showing a lower surface of a lower printed board at the lower surface of an internal circuit body in an exemplary embodiment.

As shown in FIG. 7, in the lower layer printed board 5 as well, there are arranged a first hole 5-1 through which the first boss 20 passes, a second hole 5-2 through which the second boss 21 passes, and third holes 5-3 through which the screw cylinders 23 pass.

In order to pass the first boss 20 through the holes in a state in which the internal circuit body 10 is layered in the upper case 2, the first hole 8-1 arranged in the insulating plate 8, the first hole 7-1 arranged in the upper layer printed board 7, the first hole 6-1 arranged in the insulating plate 6, and the first hole 5-1 arranged in the lower layer printed board 5 (hereafter the first holes are referred to as "H1") are aligned. In order to allow passage of the second boss 21, the second hole 8-2 arranged in the insulating plate 8, the second hole 7-2 arranged in the upper layer printed board 7, the second hole 6-2 arranged in the insulating plate 6, and the second hole 5-2 arranged in the lower layer printed board 5 (hereafter the second holes are referred to as "H2") are aligned. In order to allow passage of the screw cylinders 23, the third holes 8-3 arranged in the insulating plate 8, the third holes 7-3 arranged in the upper layer printed board 7, the third holes 6-3 arranged in the insulating plate 6, and the third holes 5-3 arranged in the lower layer printed board 5 (hereafter the third holes are referred to as "H3") are aligned.

Figure 8:
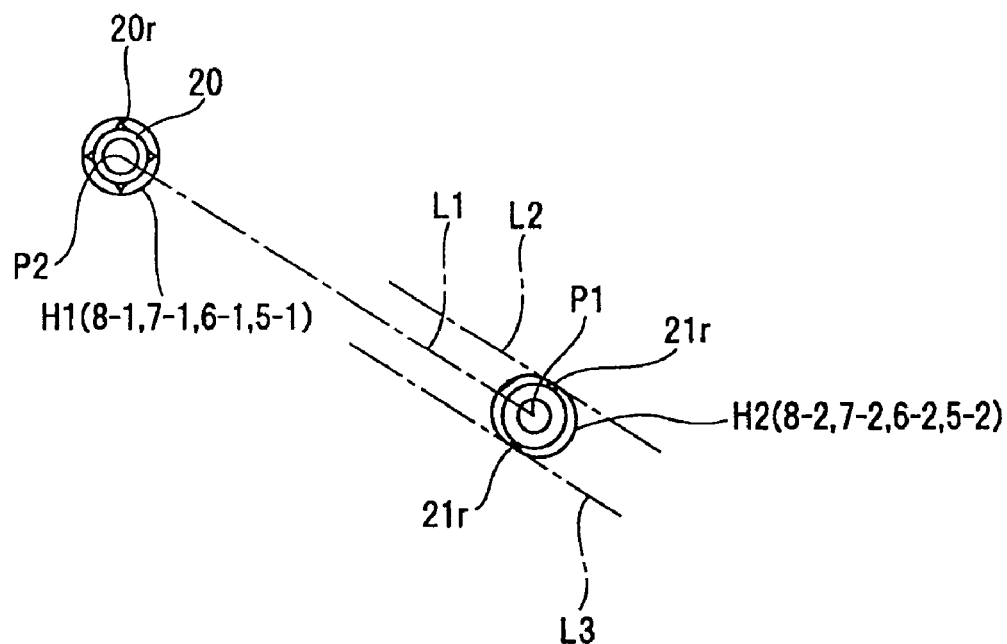
FIG. 8 is a plan view showing the relationship between a first boss and a second boss in an exemplary embodiment.

As shown in FIG. 8, the first holes H1 positioned substantially at the center of the internal circuit body 10 have a completely circular shape which is concentric with the first boss 20, and an internal diameter of the holes H1 has a clearance slightly larger than the outer diameter of the first boss 20.

As shown in FIG. 8, the second holes H2 positioned at the corner of the internal circuit body 10 have an oblong shape. Specifically, the second holes H2 have on oblong shape, of which the long sides are on straight lines L2, L3 parallel to a straight line L1 that connects a center point P1 of the respective second holes 8-2, 7-2, 6-2, and 5-2 and a center point P2 of the respective first holes 8-1, 7-1, 6-1, and 5-1. The first holes H1 are positioned substantially at the center of the internal circuit body 10. The second holes H2 are in a corner of the rectangular shape. Thus, as shown in FIG. 7, the straight line connecting the center points P1 and P2 is in a direction inclined with respect to a straight line of a periphery of the internal circuit body 10. Therefore, the long-axis direction of the elongate second holes H2 is a direction inclined, and not parallel or perpendicular, with respect to the periphery 10a, 10b of the internal circuit body 10.

Additionally, on the outer circumference of the first boss 20, four ribs 20r are arranged at an interval of 90 degrees, and extend in the axial direction. The ribs 20r press against an inner circumferential surface of the first outer cylinder 30 so as to prevent rotation of the first boss 20.

Meanwhile, at diametrically opposed positions of the second boss 21, a pair of ribs 21r extend in the axial direction. The ribs 21r press against the inner circumferential surface of a second outer cylinder 33. A protruding position of the ribs 21r protrudes toward opposing long-side directions of the oblong second holes 8b and 26 arranged in the insulating plate 8 and the internal circuit body 10, and the ribs 21r press against the inner circumferential surface of the second outer cylinder 33 so as to suppress the elongate hole from moving in the length direction. Furthermore, the ribs 20r and 21r also have an effect of improving the strength of the respective first and second bosses 20, 21.

The inner diameter of the third holes H3 through which the screw cylinders 23 pass is slightly larger than the outer diameter of the screw cylinders 23, so as to arrange a gap to a degree that the screw cylinders 23 can easily pass through.

Figure 9:
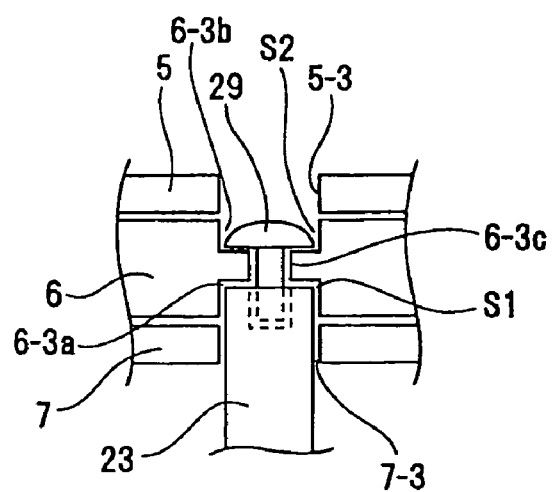
FIG. 9 is a cross-sectional view showing screw holes of an internal circuit body in an exemplary embodiment.

As shown in FIG. 9, with respect to the third holes H3 arranged in the internal circuit body 10, as seen from a thickness direction of the insulating plate 6, the third hole 6-3 of the insulating plate 6 has an upper portion opening 6-3a and a lower portion opening 6-3b, and a middle portion opening 6-3c which is arranged between the respective upper and lower portion openings 6-3a, 6-3b and is a small opening area. A space S2 in which a head portion of a screw 29 is housed and a space S1 in which a tip end portion of the screw cylinder 23 is housed are formed. The third holes 7-3 and 5-3 of the upper layer printed board 7 and the lower layer printed board 5, the upper portion opening 6-3a, and the lower portion opening 6-3b have the same diameter. Thus, the tip end portions of the screw cylinders 23 are arranged in the space S1 provided in the third holes 6-3 of the insulating plate 6 and tight affixing is accomplished by passing the screws 29 into the tip end portions of the screw cylinders 23 through the middle opening 6-3c from the third hole 5-3 side of the lower layer printed board 5.

Figure 10:
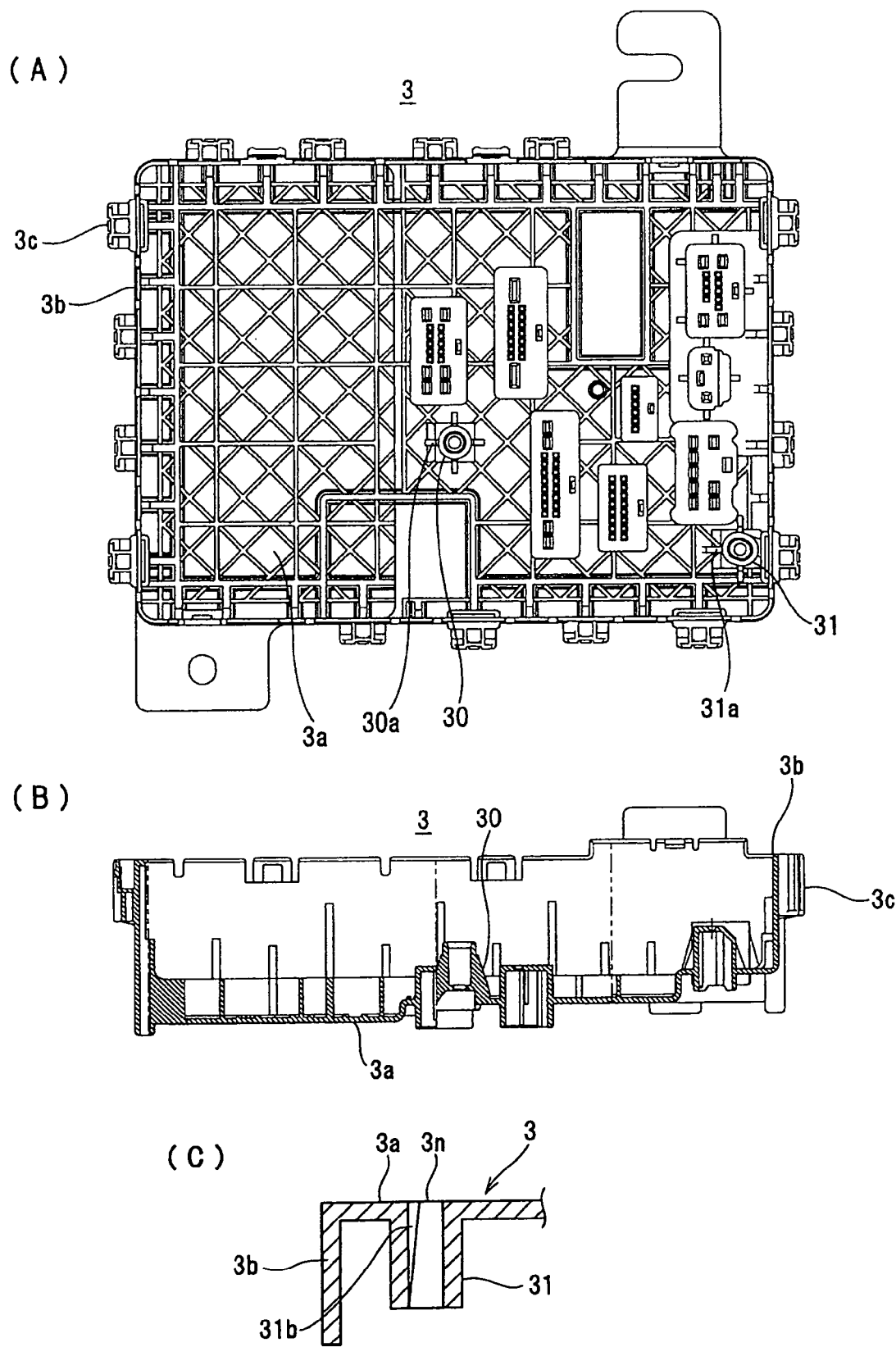
FIGS. 10A and 10B illustrate a lower case.
FIG. 10(C) is a cross-sectional view of a second outer cylinder.

As shown in FIGS. 10(A)-10(C), the first outer cylinder 30 and second outer cylinder 31 protrude from the inside surface of the lower wall 3a of the lower cover 3, at positions opposite to the first and second bosses 20, 21. The first outer cylinder 30 is a completely cylindrical tube, and the second outer cylinder is an oblong tube. Furthermore, at the outer circumferences of both the first and second outer cylinders 30, 31, ribs 30a, 31a protrude from the bottom wall 3a at intervals of 90 degrees.

As shown in FIG. 10(C), on the inner circumferential surface of the second outer cylinder 31, a tapered protruding portion 31b is arranged which gradually protrudes toward the bottom wall 3a on the inner circumferential surface of the peripheral wall 3b side and is inclined in an axial direction. Inclination of the second boss 21 inserted into the second outer cylinder 31 is corrected by the tapered protruding portion 31b, so the second boss 21 is positioned in a direction perpendicular to the bottom wall 3a of the lower case 3 and the upper wall 2a of the upper case 2. Thus, a screw hole 21n arranged in the tip end of the second boss 21 and a screw hole 3n arranged in the second outer cylinder 31 are arranged on the same axial line. Thus, operability of tightening screws from the outer surface of the bottom wall 3a of the lower case 3 is improved.

Additionally, as shown in FIG. 8, on the outer circumference of the first boss 20, four ribs 20r are protrudingly arranged at intervals of 90 degrees, and extend in the axial direction. The ribs 20r press against an inner circumferential surface of the first outer cylinder 30 so as to prevent rotation of the first boss 20.

Meanwhile, at diametrically opposed positions of the second boss 21, a pair of ribs 21r is extended in an axial direction. The ribs 21r press against the inner circumferential surface of the second outer cylinder 33. The protruding positions of the ribs 21r are arranged toward a long-side direction opposite to the oblong second holes 8b, 26 arranged in the insulating plate 8 and the internal circuit body 10, and the ribs 21r press against the inner circumferential surface of the second outer cylinder 33 so as to suppress the elongate hole from moving in a length direction.

The following explains a method of assembling the electrical connection box 1.

The bus bars 9 are fixed and mounted to an inner surface of the upper case 2. Next, the insulating plate 8, the upper layer printed board 7, the insulating plate 6, and the lower layer printed board 5 are mounted in order. Furthermore, it can be integrally fixed in advance so as to sandwich the printed boards 7 and 5 of the upper and lower layers.

When the electrical connection box 1 is assembled, the upper case 2 is inverted, and using the upper wall 2a as a lower surface, it is held on a jig (not shown) for assembly.

Figure 11:
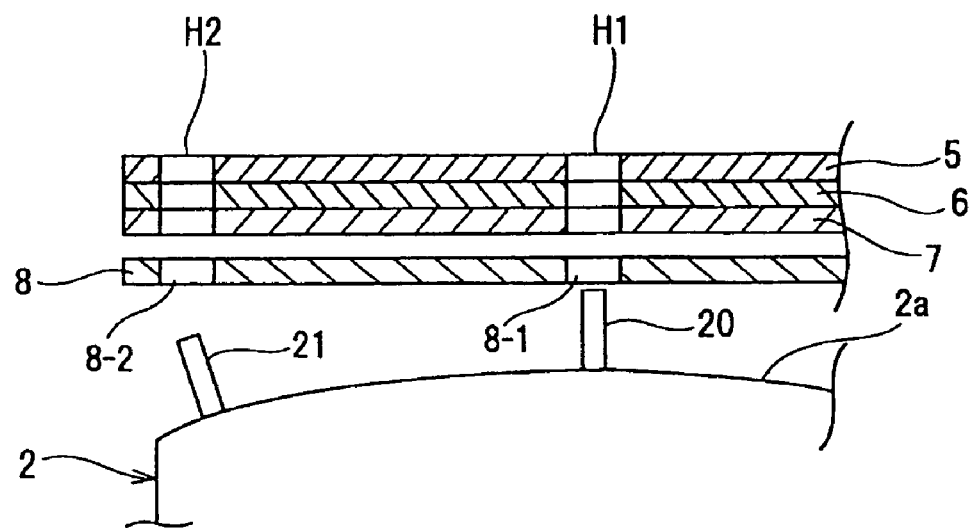
FIG. 11 is an explanatory view showing the relationship between a second boss and a second hole during assembly of an electrical connection box in an exemplary embodiment.

At that time, as shown in FIG. 11, there are cases that the upper wall 2a is flexed so as to be slightly curved toward both sides in the long-side direction. Therefore, the first boss 20 substantially at the center of the upper wall 2a raises substantially perpendicularly from the inside of the upper wall 2a, but the second boss 21 arranged at the corner tends to raise at a diagonal inclination due to the flexure of the upper wall 2a. Furthermore, there is also a concern that the longer the entire length of the boss becomes, the larger the degree of the inclination.

The bus bars 9 are pressed into the upper case 2 set in the above-mentioned assembly jig, and enter into the insulating plate 8. At that time, the first boss 20 goes through the first hole 8-1, the second boss 21 goes through the second hole 8-2, which is oblong, and the screw cylinders 23 go through the third holes 8-3.

At that time, the first boss 20 is perpendicularly set, so it can smoothly go through the first hole 8-1. The inner diameter of the third holes 8-3 is also enlarged, so the screw cylinders 23 can smoothly go through the third holes 8-3.

Meanwhile, if the second boss 21 is inclined, shifting from the second hole 8-2 occurs. However, the second hole 8-2 is an elongate hole, and a length direction of the second hold 8-2 is extended in a direction in which the second boss 21 is inclined. Thus, the second boss 21 can smoothly go through the second hole 8-2.

Next, the upper layer printed board 7, the insulating plate 6, and the lower layer printed board 5 are assembled. At that time, the first holes H1 through which the first boss 20 of the internal circuit body 10 passes, the second holes H2 through which the second boss 21 passes, and the third holes H3 through which the screw cylinders 23 pass are arranged on substantially the same axial line in a layered state. The first and second bosses 20, 21 pass respectively through first holes H1 and the second holes H2. In particular, because the inclined second boss 21 goes through the elongate second holes H2, the internal circuit body 10 can be passed through without difficulty.

Figure 12:
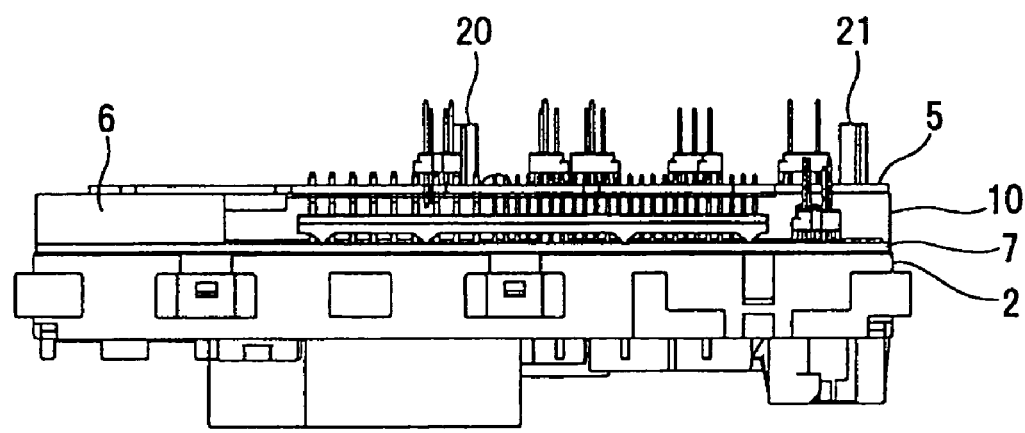
FIG. 12 is a front view of a state in which an upper case, an insulating plate and an internal circuit body are assembled in an exemplary embodiment.
Figure 13:
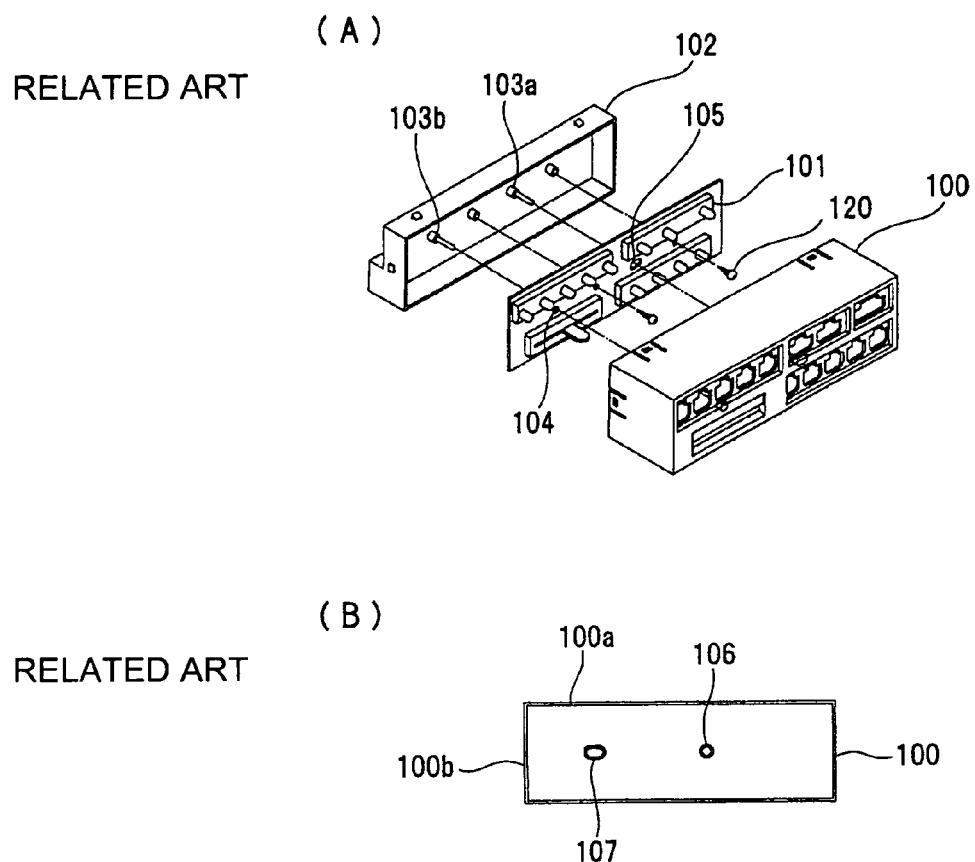
FIGS. 13(A) and (B) are drawings showing related art.

Among the third holes H3 of the internal circuit body 10, the screw cylinders 23 press against the third hole 8-3 of the insulating plate 8, the third hole 7-3 of the upper layer printed board 7, and the third hole 6-3 of the insulating plate 6. The tip end portions of the screw cylinders 23 are arranged in the space S1 arranged in the third holes 6-3 of the insulating plate 6. In this state, as described above, the screws 29 are inserted from the third hole 5-3 side of the lower layer printed board 5, and the upper case 2 and the internal circuit body 10 are tightly fixed by the screws. This assembly results in a state as shown in FIG. 12.

Then, the lower case 3 is put on, using the bottom wall 3a as an upper surface. At that time, the first boss 20 protruding from the internal circuit body 10 is inserted into the inside of the first outer cylinder 30 of the lower case 3, and the second boss 21 is inserted into the inside of the second outer cylinder 31.

In the inserted state, the four ribs 20r on the outer circumference of the first boss 20 press against the inner circumferential surface of the first outer cylinder 30 at intervals of 90 degrees so as to suppress the rotation of the first boss 20. Furthermore, the two ribs 21r on the outer circumference of the second boss 21 press against opposing surfaces of the inner circumferential surface of the second outer cylinder 31, and suppress movement of the second boss 21.

Additionally, the second boss 21 is changed from an inclined state to a perpendicular direction by the tapered protrusion portion 31b within the second outer cylinder 31.

A lock portion 2c and a lock receiving portion 3c are engaged in a state in which the lower case 3 is connected to the upper case 2. Assembly of the electrical connection box 1 is completed by screw-connecting the first boss 20 and the first outer cylinder 30, and the second boss 21 and the second outer cylinder 31, from the outside surface of the bottom wall 3a of the lower case. This results in the state shown in FIG. 2.

Thus, according to the exemplary embodiments, when assembling the internal circuit body 10 to the upper case 2 in order, the orientation of the elongate second holes provided in the insulating plate 8 and the internal circuit body 10 is set in consideration of distortion and flexure of the upper case 2. Thus, even if the second boss protrudes at an inclination due to distortion or flexure of the upper case 2, it can pass through the elongate hole of the internal circuit body 10 without difficulty, and assembly can be done with good operability, without causing deformation or damage of the second boss 21 or the internal circuit body 10. Additionally, by restricting movement by the ribs 21r arranged on the second boss, the corrected attitude of the second boss 21 is maintained, and so the electrical connection box 1 can reliably be assembled with good accuracy.

The exemplary embodiments are not limited to the foregoing. For example, the second boss 2 arranged on the upper case is not limited to the corner of the upper wall. It may be arranged at the periphery. Additionally, a plurality of each of the first boss and second boss may be provided. In that case, first holes and second holes are provided in the insulating plate and the internal circuit body, corresponding respectively to the first bosses and the second bosses.

Furthermore, according to the exemplary embodiments, because the bus bars 9 are directly affixed to the inner surface of the upper wall of the upper case 2, the insulating plate 8 is arranged at the upper case 2 side, but if the bus bars 9 are not directly affixed to the upper case 2, the insulating plate 8 is not needed.

Additionally, in the above-described embodiment, because the upper case 2 is inverted and the internal circuit body 10 is installed, the first and second bosses protrude from the upper case 2. However, in cases that use an assembly method in which the internal circuit body is inserted into the lower case 3, and then the upper case 2 is put on, the first and second bosses protrude from an inner surface of the bottom wall of the lower case, and the first and second outer cylinders are arranged on the inner surface of the upper wall of the upper case.

Furthermore, the internal circuit body is not limited to an assembly of the bus bars and the printed boards. A case is also applicable in which a body of layered insulating plates and bus bars, or a circuit body in which wiring is arranged on an insulating plate, is installed within the case.

What is claimed is:

1. An electrical connection box in which an internal circuit body is installed, the electrical connection box comprising:
   a case formed by a lower case and an upper case, the case housing the internal circuit body, the internal circuit body comprising a plurality of layers with each layer defining a cylindrical first hole and a second hole, each of the cylindrical first holes of the plurality of layers being aligned with each other and each of the second holes of the plurality of layers being aligned with each other, the second holes having an oblong shape with a long side lying in a direction parallel to an axis that connects centers of the first and second holes;
   a first boss that passes through the first holes and a second boss that passes through the second holes, the first and second bosses each being cylindrical and protruding from an inner surface of one of the lower case and the upper case toward the other case, the first holes being concentric with the first boss.

2. The electrical connection box of claim 1, wherein the first boss is disposed at a central portion of the case, and the second boss is disposed at a periphery of the case.

3. The electrical connection box of claim 1, wherein the first boss and the second boss each have an outer periphery, and the first holes and the second holes have an internal peripheral surface, the electrical connection box further comprising:
   a plurality of ribs that protrude from the outer periphery of the first boss, the ribs pressing against the internal peripheral surface of the first holes; and a pair of ribs protruding from the outer periphery of the second boss, the pair of ribs pressing against the inner peripheral surface of a long side of the second holes.

4. The electrical connection box of claim 1, further comprising:
   a first outer cylinder into which a protruding end of the first boss is inserted;
   a second outer cylinder into which a tip end of the second boss is inserted, the first outer cylinder and the second outer cylinder protruding from an inner surface of the other case, and
   a tapered protrusion disposed at an inner peripheral surface of the second outer cylinder, the tapered protrusion being inclined with respect to an axial direction, and corrects the protrusion direction of the second boss in a direction that is perpendicular to the inner surface of the case.

5. A method of assembling the electrical connection box of claim 1, the one case, on which the first and second bosses are arranged, being the upper case, and an upper surface opening being defined by using the upper wall of the upper case as a lower surface, the method comprising:
   engaging the internal circuit body through the upper surface opening;
   disposing a lower cover, defined by the other case, on the upper case and locking the lower cover to the upper case.

6. The electrical connection box of claim 2, wherein the first boss and the second boss each have an outer periphery, and the first holes and the second holes have an internal peripheral surface, the electrical connection box further comprising:
   a plurality of ribs that protrude from the outer periphery of the first boss, the ribs pressing against the internal peripheral surface of the first holes; and
   a pair of ribs protruding from the outer periphery of the second boss, the pair of ribs pressing against the inner peripheral surface of a long side of the second holes.

7. The electrical connection box of claim 2, further comprising:
   a first outer cylinder into which a protruding end of the first boss is inserted;
   a second outer cylinder into which a tip end of the second boss is inserted, the first outer cylinder and the second outer cylinder protruding from an inner surface of the other case, and
   a tapered protrusion disposed at an inner peripheral surface of the second outer cylinder, the tapered protrusion being inclined with respect to an axial direction, and corrects the protrusion direction of the second boss in a direction that is perpendicular to the inner surface of the case.

8. A method of assembling the electrical connection box of claim 2, the one case, on which the first and second bosses are arranged, being the upper case, and an upper surface opening being defined by using the upper wall of the upper case as a lower surface, the method comprising:
   engaging the internal circuit body through the upper surface opening;
   disposing a lower cover, defined by the other case, on the upper case and locking the lower cover to the upper case.

9. A method of assembling the electrical connection box of claim 3, the one case, on which the first and second bosses are arranged, being the upper case, and an upper surface opening being defined by using the upper wall of the upper case as a lower surface, the method comprising:
   engaging the internal circuit body through the upper surface opening;
   disposing a lower cover, defined by the other case, on the upper case and locking the lower cover to the upper case.

10. A method of assembling the electrical connection box of claim 4, the one case, on which the first and second bosses are arranged, being the upper case, and an upper surface opening being defined by using the upper wall of the upper case as a lower surface, the method comprising:
    engaging the internal circuit body through the upper surface opening;
    disposing a lower cover, defined by the other case, on the upper case and locking the lower cover to the upper case.

11. A method of assembling the electrical connection box of claim 6, the one case, on which the first and second bosses are arranged, being the upper case, and an upper surface opening being defined by using the upper wall of the upper case as a lower surface, the method comprising:
    engaging the internal circuit body through the upper surface opening;
    disposing a lower cover, defined by the other case, on the upper case and locking the lower cover to the upper case.

12. A method of assembling the electrical connection box of claim 7, the one case, on which the first and second bosses are arranged, being the upper case, and an upper surface opening being defined by using the upper wall of the upper case as a lower surface, the method comprising:
    engaging the internal circuit body through the upper surface opening;
    disposing a lower cover, defined by the other case, on the upper case and locking the lower cover to the upper case.

\* \* \* \* \*